United States Patent
Park

(10) Patent No.: US 6,742,172 B2
(45) Date of Patent: May 25, 2004

(54) MASK-PROGRAMMABLE LOGIC DEVICES WITH PROGRAMMABLE GATE ARRAY SITES

(75) Inventor: Jonathan Park, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/113,324

(22) Filed: Mar. 29, 2002

(65) Prior Publication Data

US 2003/0188287 A1 Oct. 2, 2003

(51) Int. Cl.$^7$ ............................................... G06F 17/50
(52) U.S. Cl. .............................. 716/16; 716/17; 716/18
(58) Field of Search ............. 716/16–18; 714/724–731; 326/39–41; 327/158

(56) References Cited

U.S. PATENT DOCUMENTS

| | | | | |
|---|---|---|---|---|
| 5,068,603 | A | | 11/1991 | Mahoney ................. 324/158 R |
| 5,212,652 | A | | 5/1993 | Agrawal et al. ............ 364/489 |
| 5,526,278 | A | * | 6/1996 | Powell ......................... 716/16 |
| 5,550,839 | A | * | 8/1996 | Buch et al. .................. 714/724 |
| 5,815,405 | A | | 9/1998 | Baxter ......................... 364/489 |
| 6,094,065 | A | * | 7/2000 | Tavana et al. ................. 326/39 |
| 6,118,299 | A | * | 9/2000 | Raza ............................ 326/39 |
| 6,177,844 | B1 | | 1/2001 | Sung et al. .................... 331/25 |
| 6,311,316 | B1 | | 10/2001 | Huggins et al. .............. 716/12 |
| 6,331,790 | B1 | * | 12/2001 | Or-Bach et al. .............. 326/41 |

OTHER PUBLICATIONS

Francis, R.J.; Rose, J.; Chung, K.; "Chortle: a technology mapping program for lookup table–based field programmable gate arrays Design Automation Conference", 1990. Proceedings. 27th ACM/IEEE, Jun. 24–28, 1990 pp.: 613–619.*

Wilton, S.J.E.; "Heterogeneous technology mapping for area reduction in FPGAs with embedded memory arrays Computer–Aided Design of Integrated Circuits and Systems", IEEE Transactions on , vol.: 19, Issue: 1 , Jan. 2000 pp.: 56–68.*

R. A. Bergamaschi,"Automatic Synthesis and Technology Mapping of Combinational Logic" IEEE 1988, pp. 466–469.*

Fujiwara, H.; "Enhancing random–pattern coverage of programmable logic arrays via masking technique Computer–Aided Design of Integrated Circuits and Systems", IEEE Transactions on , vol.: 8 , Issue: 9 , Sep. 1989 pp.: 1022–1025.*

Hanyu, T. et al.; "Multiple–valued mask–programmable logic array using one–transistor universal–literal circuits Multiple–Valued Logic", 2001. Proceedings. 31st IEEE International Symposium on , May 22–24, 2001 pp.: 167–172*

Xilinx, HardWire Data Book, "XC3300 Family HardWire Logic Cell Arrays," Preliminary Product Specification, 1991.

Xilinx, HardWire Data Book, pp. 1–1 through 2–28, 1994.

* cited by examiner

Primary Examiner—Matthew Smith
Assistant Examiner—Naum B Levin
(74) Attorney, Agent, or Firm—Fish and Neave; Robert R. Jackson; Jeffrey C. Aldridge

(57) ABSTRACT

A mask-programmable logic device that includes programmable gate array sites is provided. The gate array sites contain circuit elements that may be programmed to perform certain logic functions that correct problems associated with implementing a preexisting circuit design in mask-programmable device.

26 Claims, 15 Drawing Sheets

MASK-PROGRAMMABLE LOGIC DEVICES WITH PROGRAMMABLE GATE ARRAY SITES

BACKGROUND OF THE INVENTION

The present invention relates to mask programmable logic devices, and more particularly, to mask programmable logic devices that include gate array sites.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration information in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. Another variant is a mask-programmable logic device. With mask-programmable logic devices, instead of selling all users the same device, the manufacturer produces a partial device with a standardized arrangement of logic resources whose functions are not programmable by the user, and which lacks any routing or interconnect resources.

The user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of mask-programmable logic devices has allowed users to prove a design in a conventional programmable logic device, but to commit the production version to a mask-programmable logic device which, for the same functionality, can be significantly smaller and use significantly less power, because the only interconnect and routing resources are those actually needed for the particular design. In addition, there are no general purpose switching elements consuming space or power, or slowing down signals.

However, mask-programmable logic devices do not contain predefined routing resources. Therefore, the task of creating the customized interconnect for each design falls to the manufacturer in migrating the user's programmable device design to a mask-programmable device. This task is time consuming, and significantly slows down the process of migrating the design. The migration process is further complicated by the fact that certain implementation-related problems such as timing and testability violations and signal attenuation are not apparent until after an initial mask-programable device is fabricated and tested. Fixing such problems often requires redesign of the custom interconnect and/or reallocation of logic resources on the base device. This solution, however, often requires the fabrication of multiple devices to prove a given design and is therefore costly and time consuming.

Accordingly, it would be desirable to provide a way to quickly and effectively solve implementation problems by providing resources that allow some modifications to be made to the original mask design that do not involve the costly or time consuming tasks of reallocating logic resources or redesigning the customized interconnect.

SUMMARY OF THE INVENTION

It is therefore an object of the present invention to provide a way to quickly and effectively solve implementation problems by providing resources that allow modifications to be made to the original mask design that do not involve the costly or time consuming tasks of reallocating logic resources or redesigning the customized interconnect.

This and other objects of the invention are accomplished in accordance with the principles of the present invention by providing configurable gate array sites disposed on an integrated circuit for correcting implementation problems.

In one embodiment of the present invention, configurable gate array sites are disposed in various locations throughout the device to correct buffering and timing violations that may result from the streamlining of a device's interconnection and logic resources. Such gate array sites may be fabricated on a device substrate and each site may include a plurality of circuit elements (e.g., transistors) for forming fundamental logic gates. To correct a particular problem, a gate array cell that provides the desired function may be formed on a gate array site proximal to the point in the device where the violation manifests itself. This cell may be formed by interconnecting certain circuit elements found in the gate array site to obtain the desired logic function.

In another aspect of the invention, each gate array site may have some or all of its interconnections and contact points coupled to the substrate in order to reduce the cost of adding an additional contact layer mask.

Further features of the invention, its nature and various advantages will be more apparent from the accompanying drawings and the following detailed description.

DETAILED DESCRIPTION OF THE PREFERRED EMBODIMENTS

The present invention reduces the amount of time, cost, and effort required to produce a mask-programmable logic device by providing configurable gate array sites at various locations within the device. The gate array sites may be used to correct various implementation problems that may arise during the migration of a circuit design previously implemented on another integrated circuit which may have contained different interconnection and logic resources.

Figure 1:
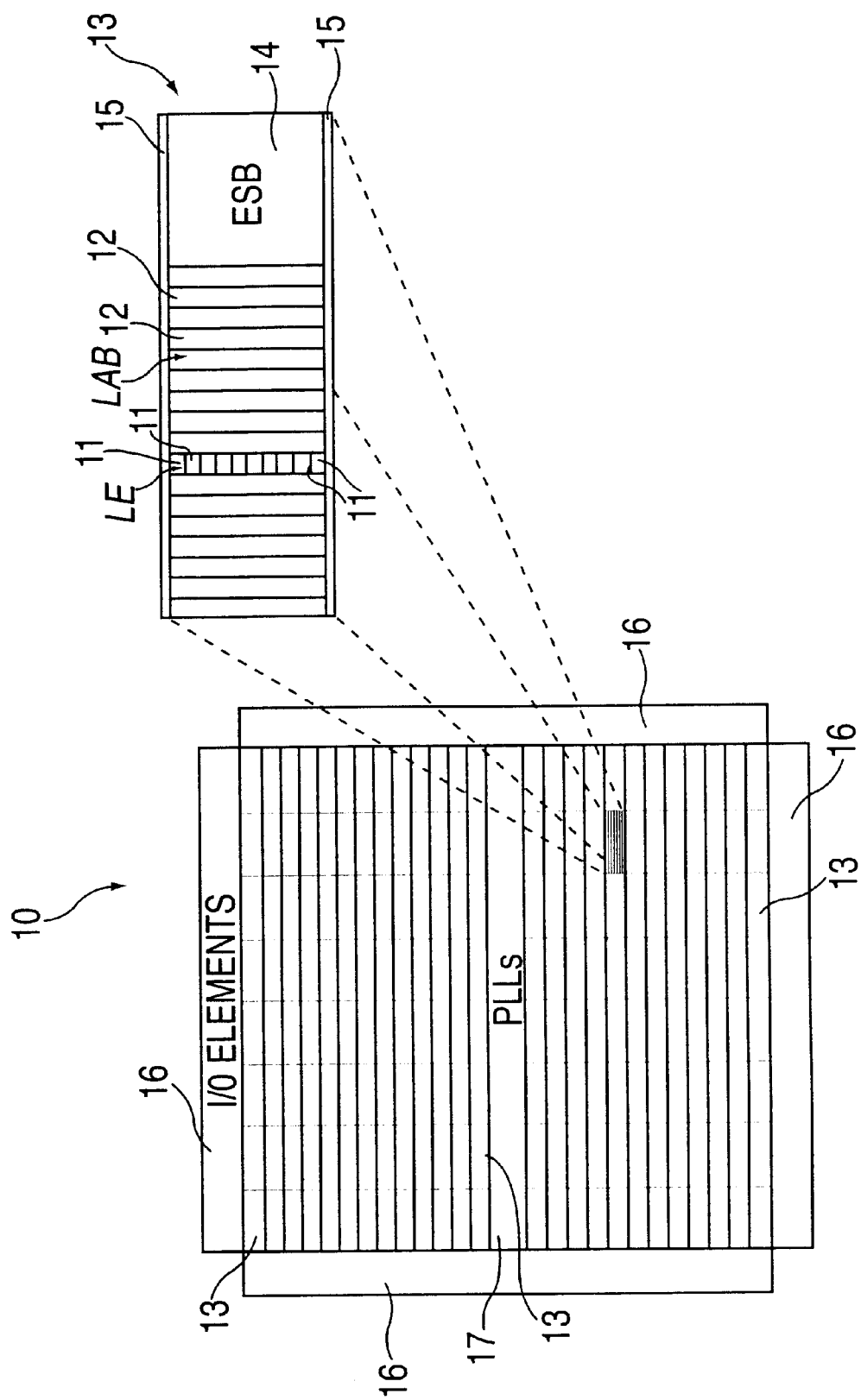
FIG. 1 is a block diagram representation of the layout of a preferred embodiment of a mask-programmable logic device in accordance with the present invention.

As seen in FIG. 1, one embodiment of a mask-programmable logic device 10 constructed in accordance with the present invention includes an array of logic regions similar to those found in the APEX family of programmable logic devices sold by Altera Corporation, of San Jose, Calif., the assignee hereof. Although an APEX® type architecture is shown, it will be understood that any type of PLD, CPLD (complex programmable logic device) or similar device may serve as a model for the base portion of the mask-programmable device, if desired.

As shown in FIG. 1, the logic regions include, at the most basic level, "logic elements" (LEs) 11, which may be, for example, look-up table-based logic regions having four inputs and the ability to have registered or unregistered outputs. Logic elements 11 may be grouped into "logic array blocks" (LABs) 12. In the embodiment shown, each LAB 12 includes ten LEs 11, although other numbers of LEs 11 could be grouped into each LAB 12. The LABs may further be grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" or ESB) 14. Each GOL 13 also includes a plurality of gate array sites 15, which may be used, e.g., for buffering or routing particular signals (described in more detail below).

As shown, GOLs 13 preferably are arranged in an orthogonal array, in rows and columns. Input/output ("I/O") elements preferably are located in regions 16 around the periphery of the array. Other auxiliary circuits, such as phase-locked loops ("PLLs") for timing, etc., preferably are provided at convenient locations within the array, such as in region 17, shown in about the center of the array.

Figure 2:
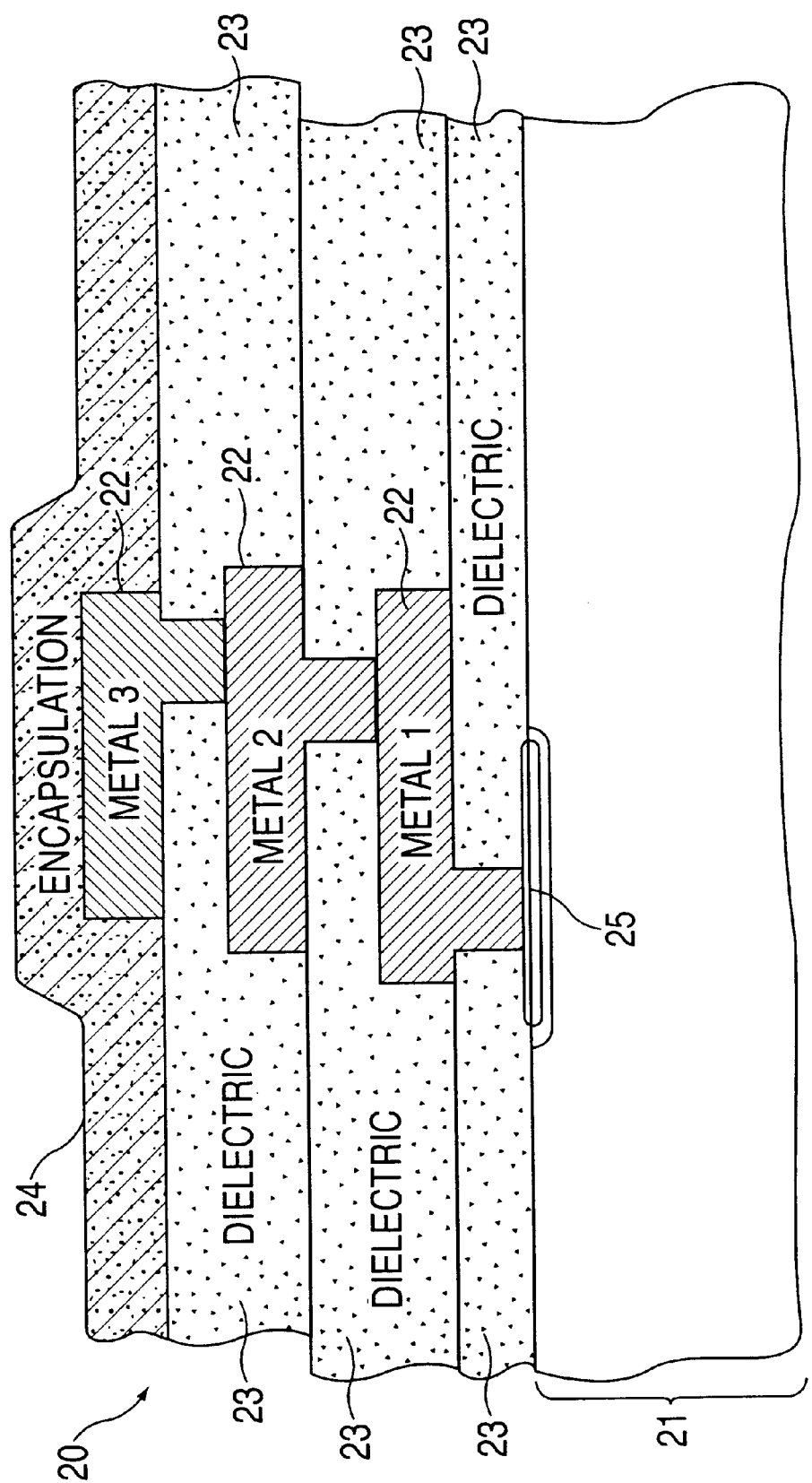
FIG. 2 is a cross-sectional view of the substrate and mask metallization layers of a mask-programmed device according to the present invention, incorporating the device of FIG. 1.

FIG. 2 shows a cross section of mask-programmable or "base" device 10 after programming i.e., after it has become a "mask-programmed" device 20, in which the substrate and other layers that make up the unprogrammed base device 10 are shown collectively at 21 (one transistor 25 is shown as representative). Additional layers of metallization 22 and dielectric 23 are used to program device 20 and create the custom interconnection networks that connect the components included in base device 10. Commonly, an encapsulation layer 24 is provided to protect metallization and dielectric layers 22 and 23.

Figure 3:
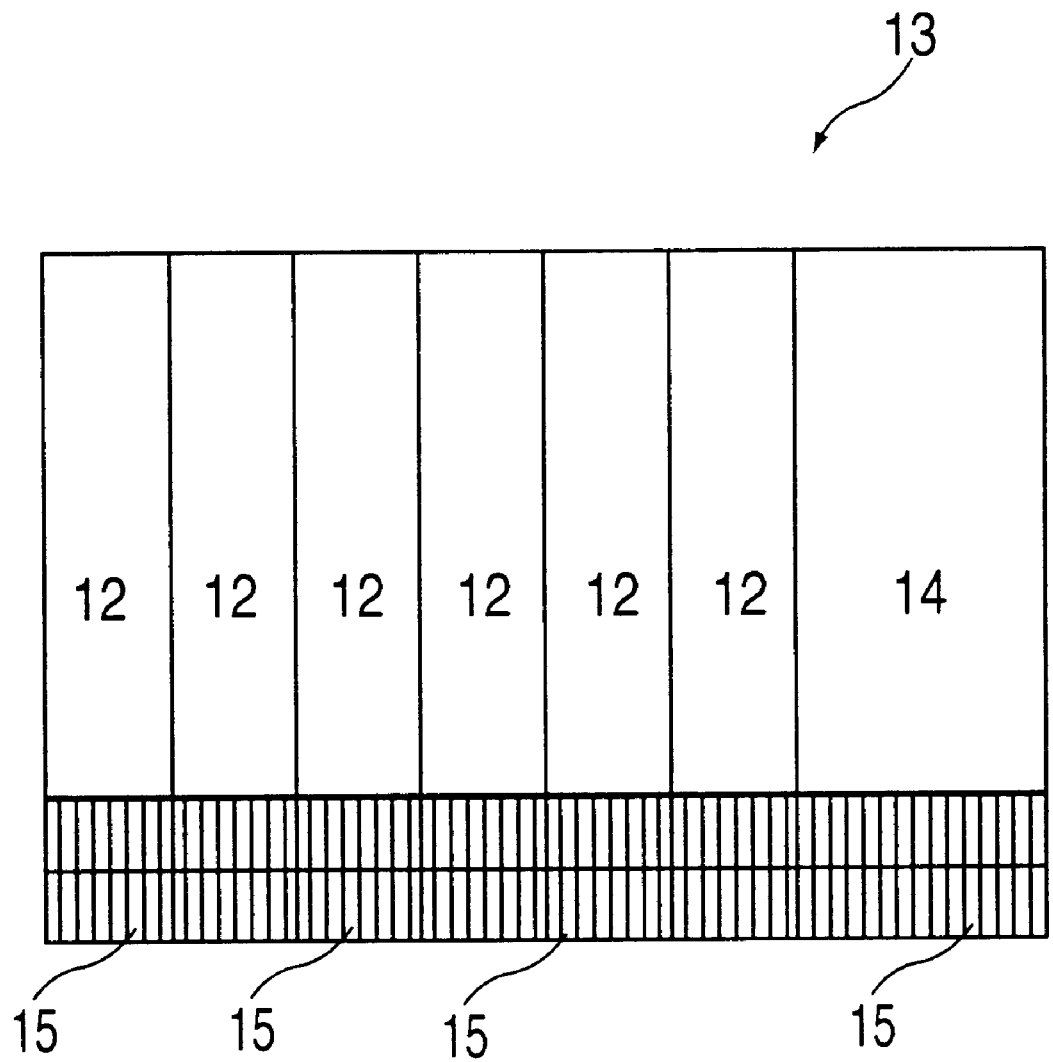
FIG. 3 is a block diagram illustrating one possible gate array arrangement in accordance with the present invention.
Figure 4:
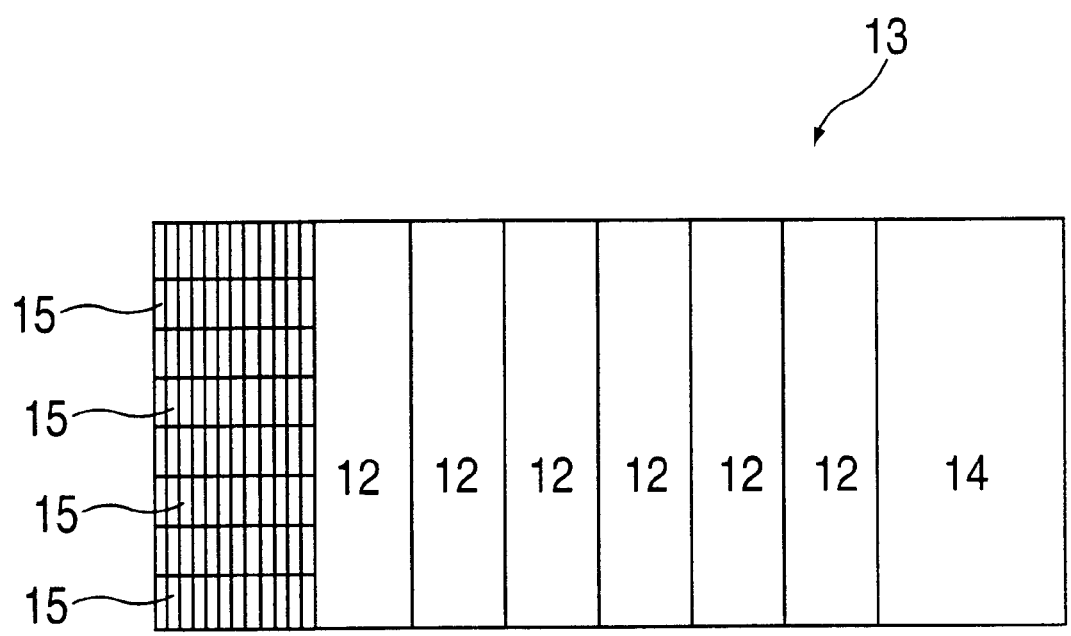
FIG. 4 is a block diagram illustrating another possible gate array arrangement in accordance with the present invention.

Gate array sites 15, which are configurable to perform desired logic functions, may be disposed in a variety of ways throughout a mask programmable logic device to correct implementation problems while minimizing device size. FIG. 3 is a block diagram illustrating how a plurality of gate array sites 15 may be physically disposed throughout GOL 13 of device 10. As shown, gate array sites 15 are disposed in two rows running horizontally along the lower edge of GOL 13. It will be appreciated that this arrangement is merely illustrative, and that many other arrangements are possible. For example, one or more columns of gate array sites 15 may be placed along the periphery of GOL 13 if desired. As shown in FIG. 4, these columns may be disposed along the leftmost LAB of GOL 13.

Figure 5:
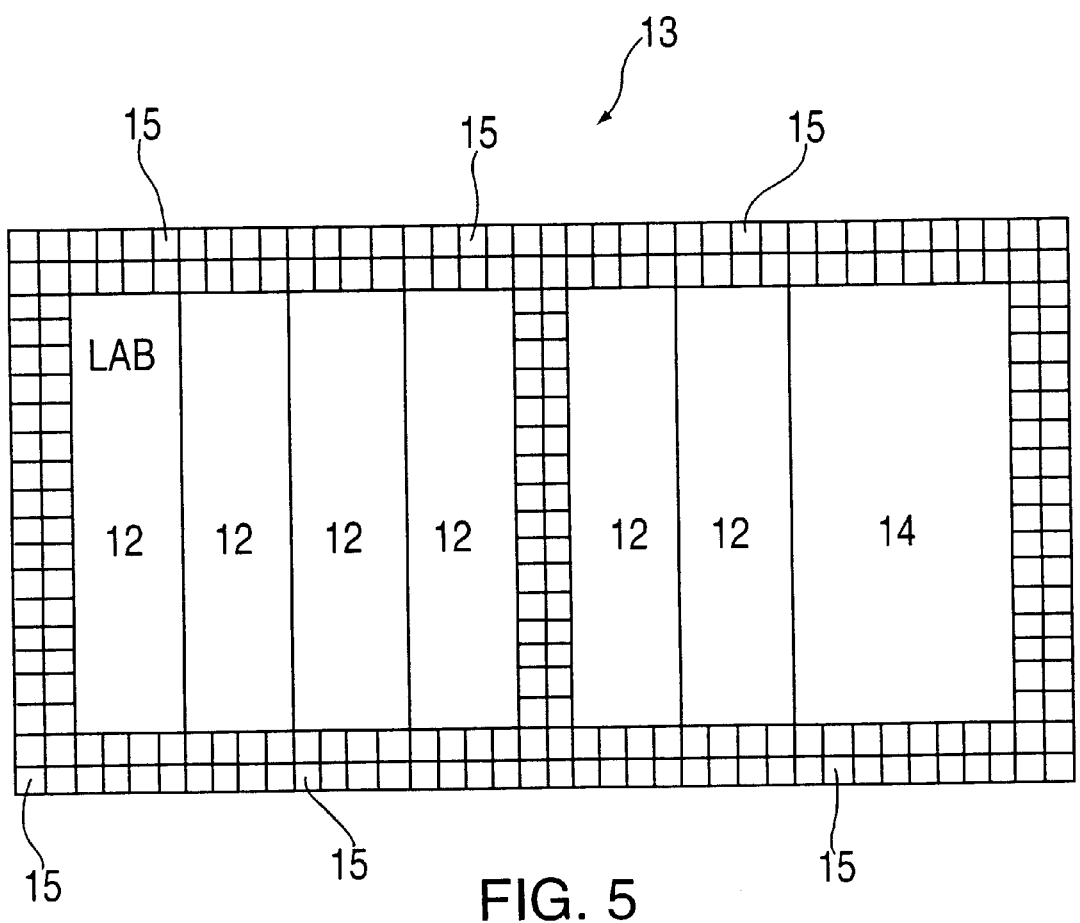
FIG. 5 is a block diagram illustrating another possible gate array arrangement in accordance with the present invention.

In yet another possible embodiment, FIG. 5 illustrates gate array sites 15 being placed throughout GOL 13 in both rows and columns. Gate array sites may also be placed between the boudary of LABs 12 and ESB 14 and/or I/O blocks 16 (not shown). Gate array sites 15 may also be randomly or uniformly placed throughout GOL 13 in patterns other than rows and columns if desired, e.g., in a checkerboard pattern (not shown).

The particular pattern of gate array sites used may be based on the type of interconnections needed to implement a specified circuit design. For example, if the circuit implementation requires a considerable number of interconnections between adjacent GOLs, then the majority of gate array sites 15 may be placed along the boundaries between the GOLs. In some embodiments, this may be done so that sites 15 favor a certain interconnection direction (e.g., two rows of sites 15 in the vertical direction and only one in the horizontal direction, etc.). On the other hand, if the specified circuit design requires significant amount of interconnections within the GOLs, then the majority of gate array sites may be placed between the LABs of that GOL with a reduced number around the periphery. Other embodiments may use a combination of these approaches to provide interconnection both between and within the GOLs on device 10.

Figure 6:
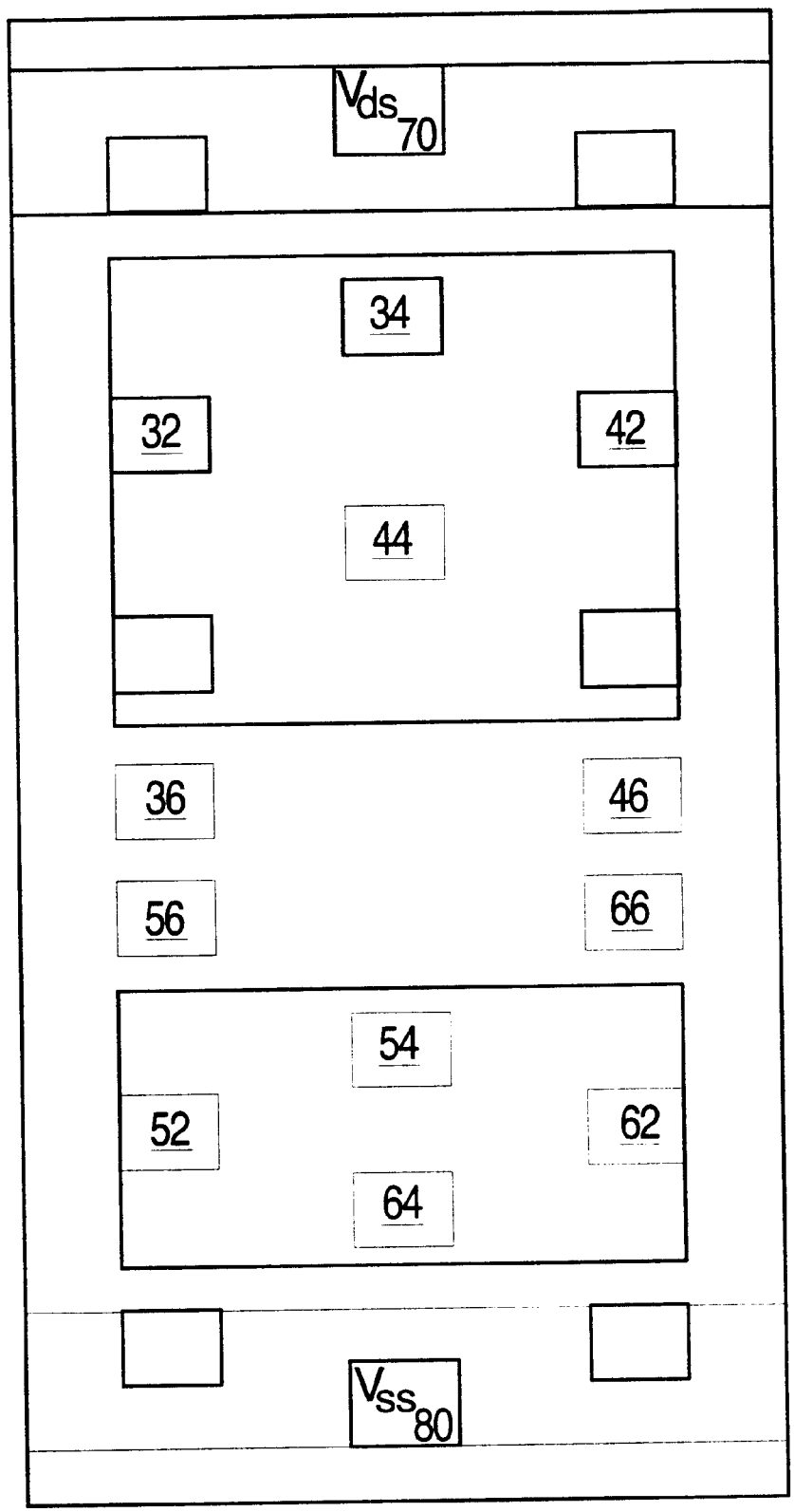
FIG. 6 is a block diagram illustrating one possible physical layout of a gate array site constructed in accordance with the principles of the present invention.

In FIG. 6, a diagram illustrating one possible layout of gate array site 15 is shown. This site may contain a plurality of circuit elements (e.g., N-well and P-well sites) suitable for constructing transistors. Gate array site 15 may also include power supply pins. It will be understood that this embodiment is merely illustrative, and that many other arrangements with more or less circuit elements are possible. It will also be appreciated that other gate array site arrangements may have more, less, or no power supply pins at all, and that circuitry within the site may be powered by external sources. Gate array site 15 may be considered to be "programmable" to the extent that interconnection conductors may be coupled to contact pins connected to the circuit elements within the site. Such programmability allows a generic gate array site 15 to form a gate array cell with a specific function. The actual contents of each individual gate array site may vary depending on the type of implementation problems it is intended to correct. Furthermore, it will be understood that several different types of gate array sites 15 (i.e., those with different contents) may be disposed throughout base device 10 to provide optimal error correction.

Figure 7:
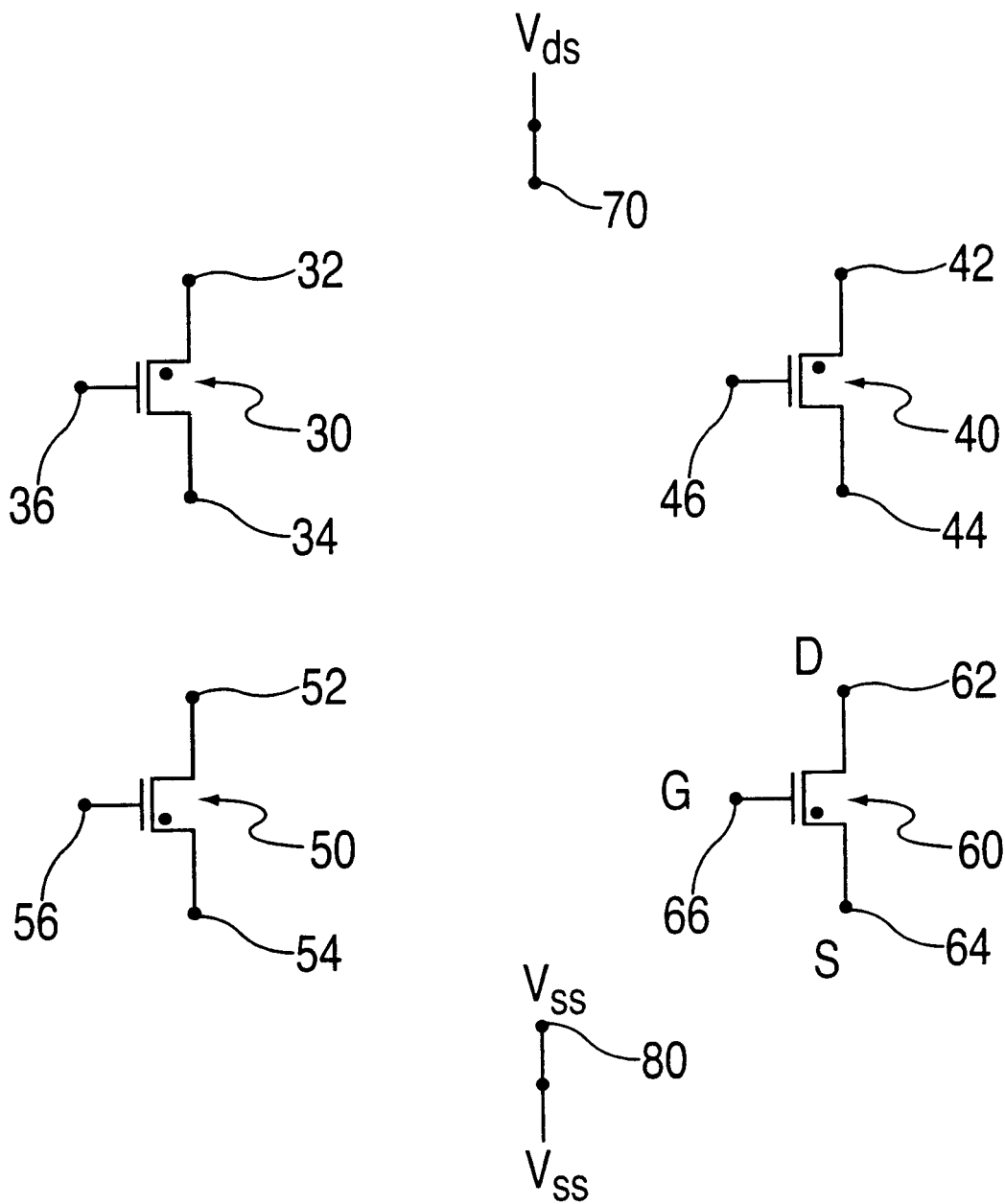
FIG. 7 is a schematic diagram of the logic resources shown in FIG. 6.

The equivalent circuitry that corresponds to the general layout of gate array site 15 in FIG. 6 is shown in FIG. 7. As shown, two P-channel type field effect transistors 30 and 40, and two N-channel type field effect transistors 50 and 60 may be included in gate array site 15. Transistors 30 and 40 each have drain terminals 32 and 42, source terminals 34 and 44, and gate terminals 36 and 46, respectively. Transistors 50 and 60 each have drain terminals 52 and 62, source terminals 54 and 64, and gate terminals 56 and 66, respectively. These elements are marked in FIG. 6 to clearly illustrate how each gate array site 15 may be constructed.

In FIG. 7, two power supplies, Vds and Vss are shown to have contact pins 70 and 80, respectively. These power supplies may be used to provide bias voltages to the circuitry within the gate array site. It will be appreciated that the orientation of each of these pins with respect to gate array site 15 and the other pins is merely illustrative, and that many other arrangements are possible. For example, transistors 30–60 may be oriented linearly, as opposed to the box-like shape shown. Furthermore, power supply pins 70 and 80 need not necessarily be considered part of the gate array site. Power may be provided to gate array site 15 by external sources.

Figure 8:
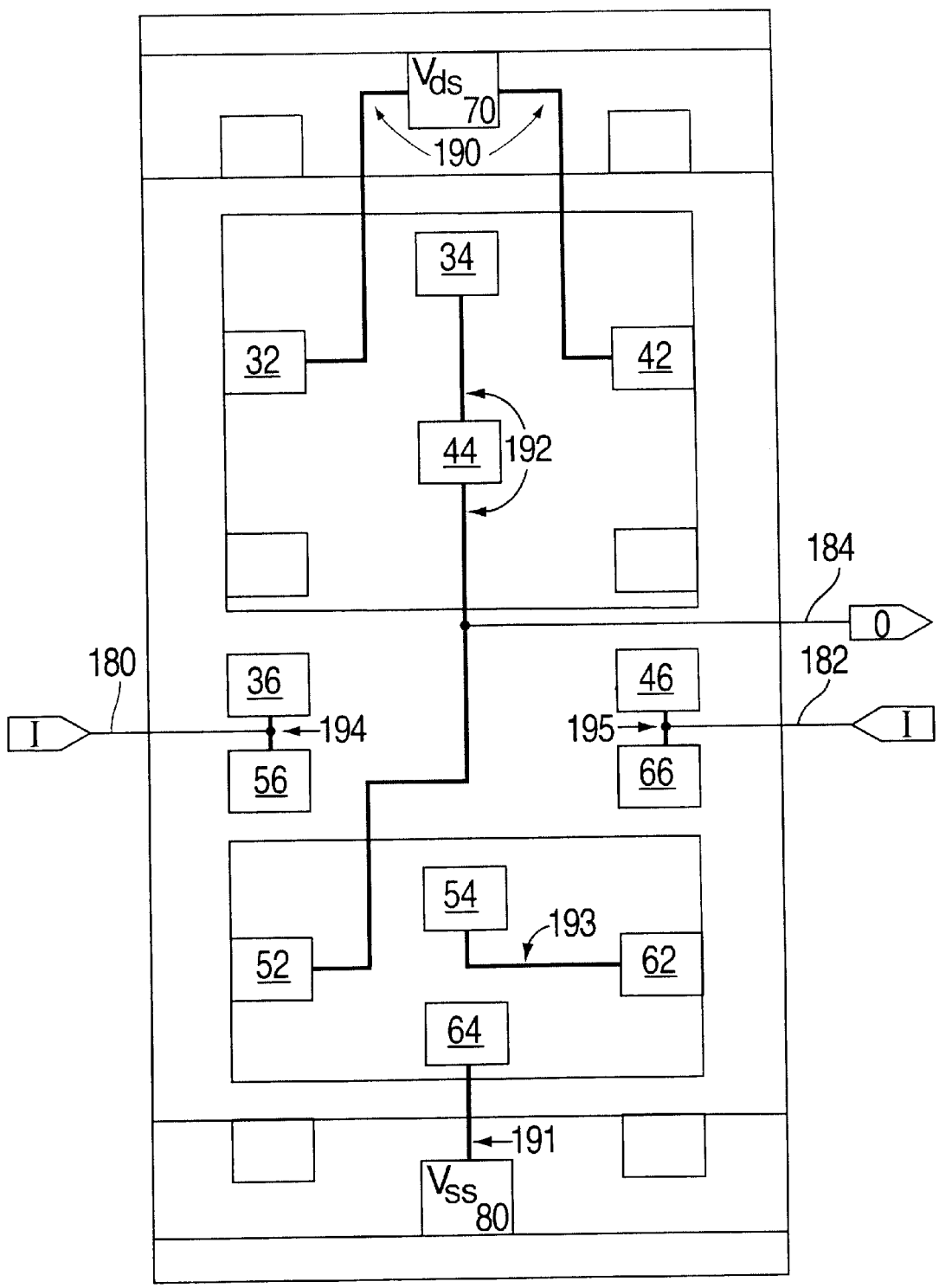
FIG. 8 is an interconnection diagram illustrating one way of interconnecting the gate array site of FIG. 6 to obtain a two input NAND gate.

The contact points of gate array site 15 may be interconnected to obtain a gate array cell with a desired function. Generally speaking, a gate array cell is a programmed (configured) gate array site. FIG. 8 shows a particular arrangement of interconnections suitable for forming a two-input NAND gate from a gate array site 15 (illustrated as gate array cell 100). As depicted, gate array cell 100 has all of the same pins as gate array site 15. In this embodiment, two input pins 180 and 182 (designated as "I" pins) and an output pin 184 (designated as an "O" pin) are included.

Input/Output ("I/O") pins 180, 182, and 184 may provide and receive signals accordingly and may be individually coupled to any number of the aforementioned interconnections of gate array site 15. These I/O pins are not shown in FIG. 6 or 7, however, because they are usually external from the site (i.e., the cell). The I/O pins are usually coupled to gate array site 15 when forming a gate array cell 100 to perform a specific function using the signals supplied by the I/O pins.

As shown in FIG. 8, interconnection segment 190 provides bias voltage to the cell by connecting Vds pin 70 to drain terminals 32 and 42. Interconnection segment 191 connects Vss pin 80 to source terminal 64 thereby connecting the drain of transistor 60 to the power plane (Vss may also be a ground plane in certain embodiments) Interconnection segment 192 connects source terminals 34 and 44 to the drain terminal of transistor 50 (terminal 52) Source terminal 54 is connected to drain terminal 62 by interconnection segment 193 to complete the circuit. Finally, interconnection segment 194 connects gate terminals 36 and 56, and interconnection segment 195 connects gate terminals 46 and 66. This arrangement allows gate array site 15 to form gate array cell 100 with the desired function of a two-input NAND gate by coupling input pin 180 to interconnection segment 194, input pin 182 to interconnection segment 195, and output pin 184 to interconnection segment 192.

Figure 9:
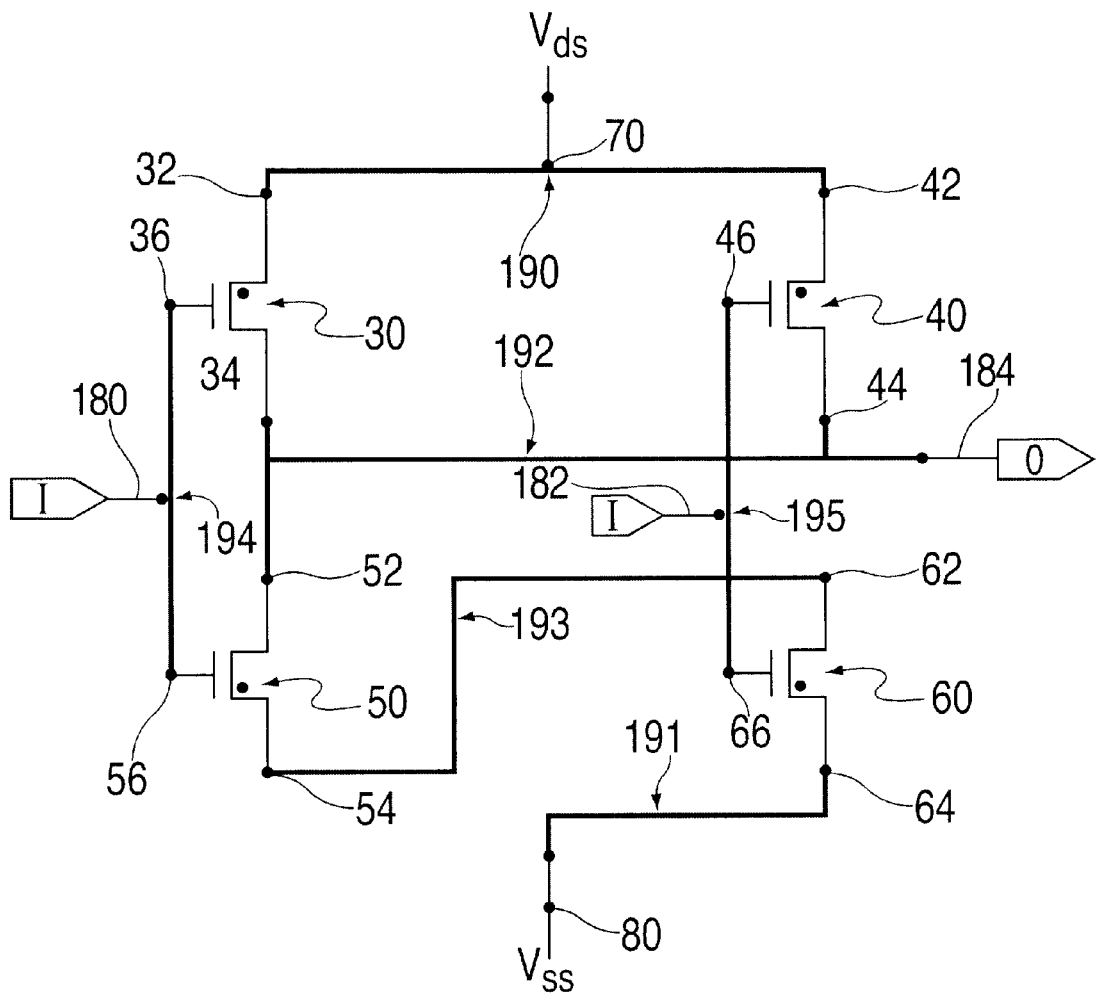
FIG. 9 is a schematic diagram of the gate array site shown in FIG. 8.

FIG. 9 is a schematic representation of gate array cell 100 shown in FIG. 8. Interconnection segments 190–195 are included in the schematic to clearly illustrate the interconnection of circuit elements within gate array cell 100.

Figure 10:
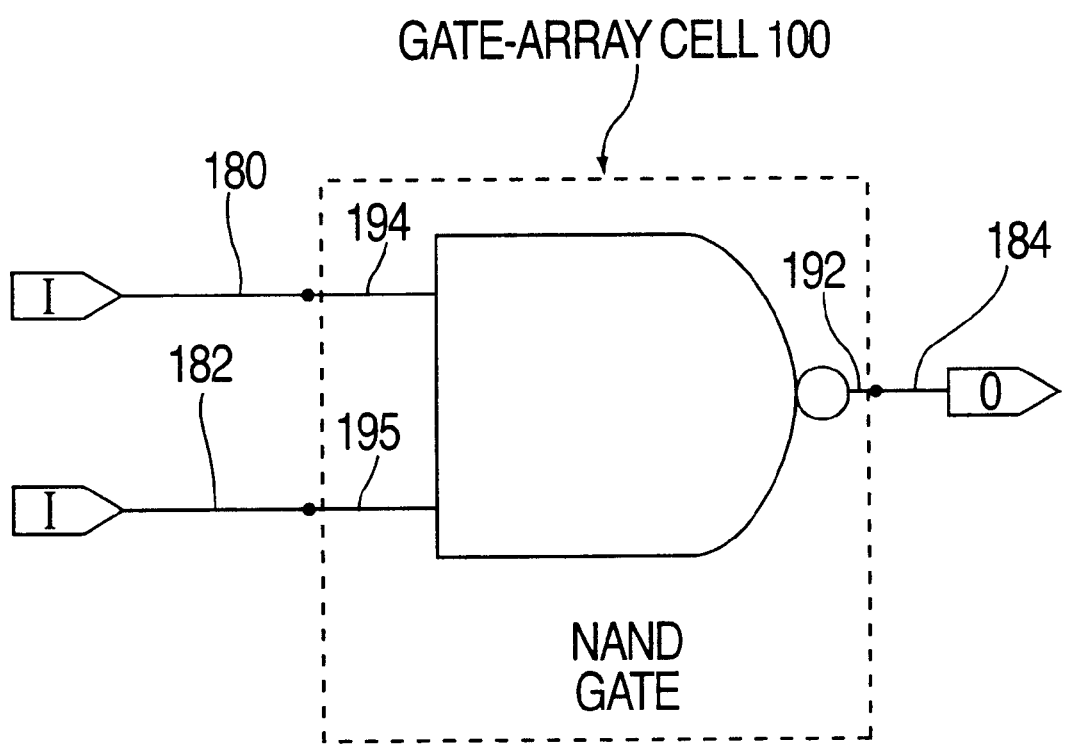
FIG. 10 is a logic symbol representation of the gate array site shown in FIGS. 8 and 9.

FIG. 10 is a logic block representation of the two-input NAND gate shown in FIG. 9. Included are I/O pins 180, 182, and 184, and interconnections 192, 194, and 195.

It will be appreciated that the interconnection arrangement shown in FIGS. 8 and 9 are merely illustrative, and that other arrangements, which may produce many other fundamental logic gates, are possible. For example, gate array site 15 may be configured to form a wide range of logic gates including, but not limited to, AND gates, OR gates, inverters, buffers, NOR gates, XOR gates, exclusive NOR gates, etc. Moreover it will be understood that multiple logic array sites 15 (or cell sites 100) may be combined together to produce more advanced logic circuits such as flip-flops, registers, counters, delay elements, adders, and the like.

Figure 11:
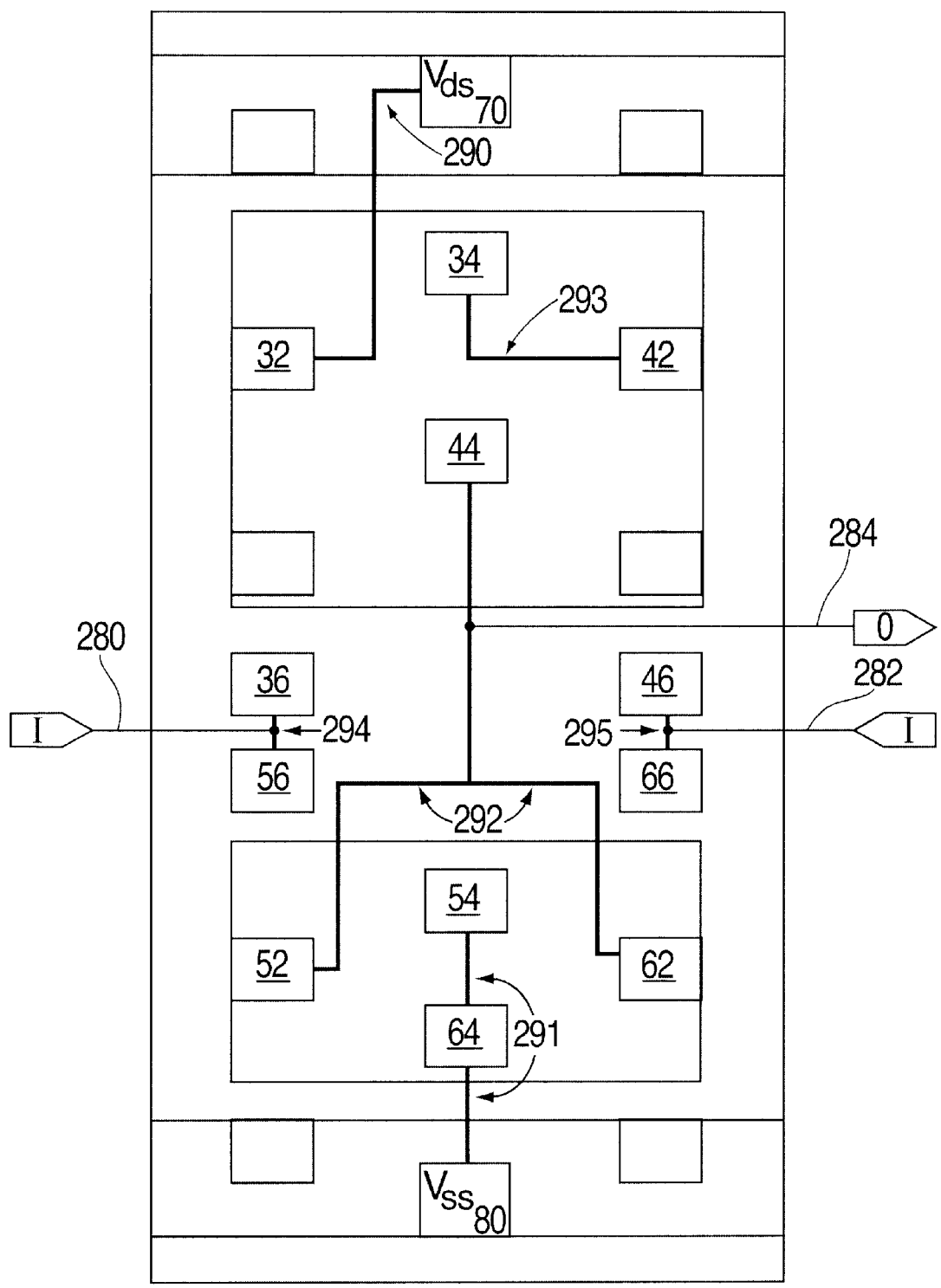
FIG. 11 is an interconnection diagram illustrating one way of interconnecting the gate array site of FIG. 6 to obtain a two input NOR gate.

An example of another basic logic gate that may be constructed with gate array site 15 is shown in FIG. 11. The interconnection arrangement shown is suitable for making a two-input NOR gate array cell (cell 200). Different cells (i.e., cells 100 and 200) may vary from one another only with respect to the interconnections used and the I/O pins that are coupled to these interconnections.

As shown in FIG. 11, interconnection segment 290 provides bias voltage to the cell by connecting Vds pin 70 to drain terminal 32. Interconnection segment 291 connects Vss pin 80 to source terminals 54 and 64 thereby connecting the drain of transistors 50 and 60 to the power plane (Vss may also be a ground plane in certain embodiments). Interconnection segment 292 connects drain terminals 52 and 62 to the source terminal of transistor 40 (terminal 44). Source terminal 34 is connected to drain terminal 42 by interconnection segment 293 to complete the circuit. Finally, interconnection segment 294 connects gate terminals 36 and 56, and interconnection segment 295 connects gate terminals 46 and 66. This arrangement allows gate array site 15 to form gate array cell 200 with the desired function of a two-input NOR gate by coupling input pin 280 to interconnection segment 294, input pin 282 to interconnection segment 295, and output pin 284 to interconnection segment 292.

Figure 12:
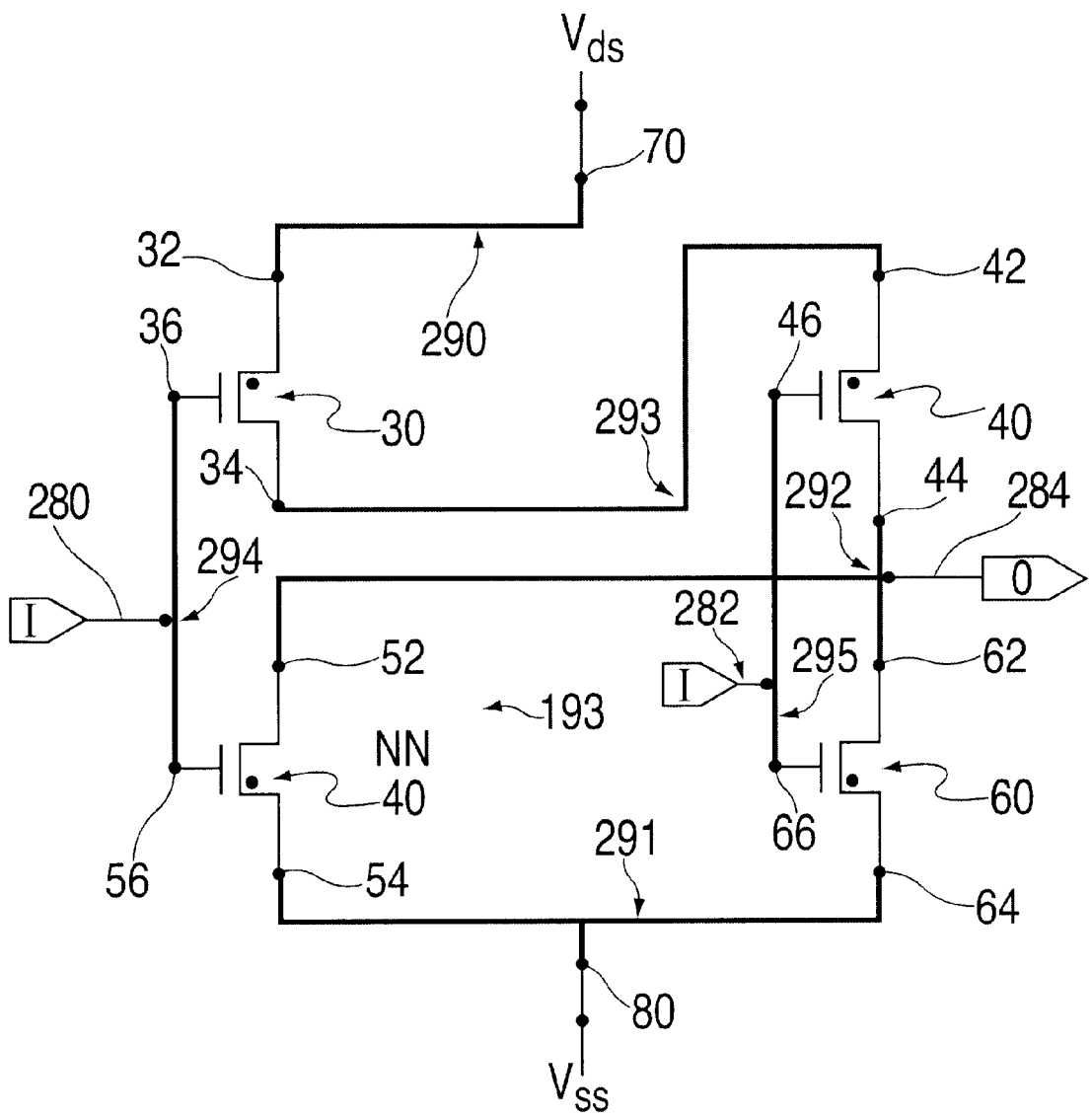
FIG. 12 is a schematic diagram of the gate array site shown in FIG. 11.

FIG. 12 is a schematic representation of gate array cell 200 shown in FIG. 11. Interconnection segments 290–295 are included in the schematic to clearly illustrate the interconnection of circuit elements within gate array cell 200.

Figure 13:
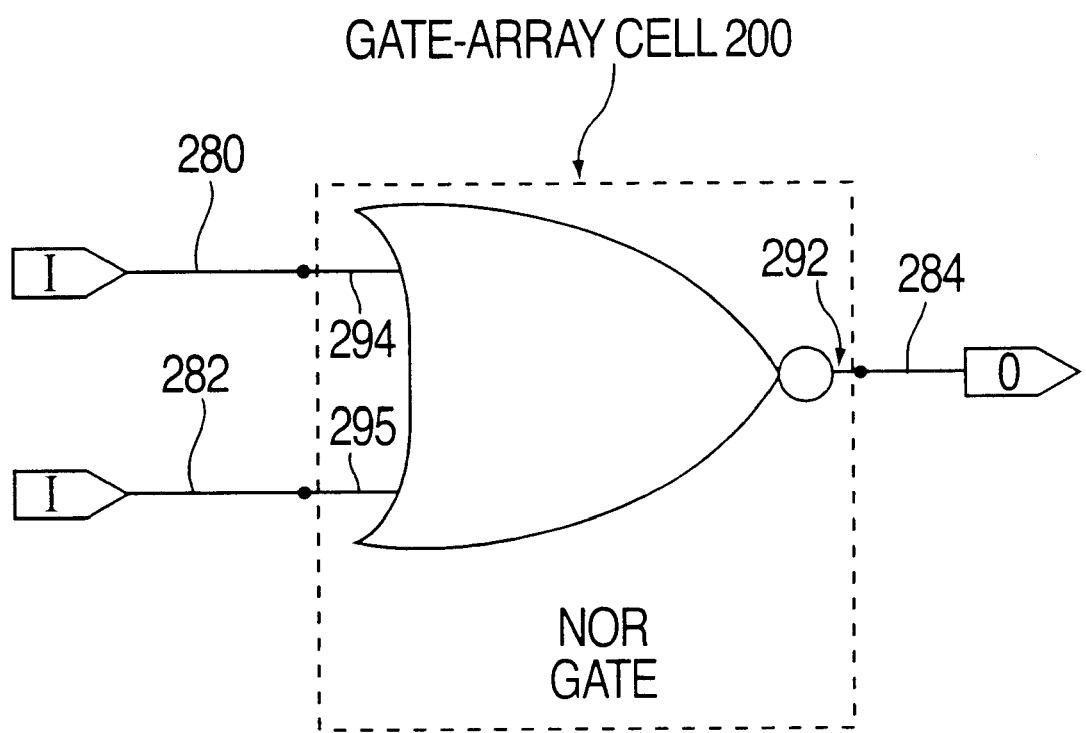
FIG. 13 is a logic symbol representation of the gate array site shown in FIGS. 11 and 12.

FIG. 13 is a logic block representation of the two-input NOR gate shown in FIG. 12. Included are I/O pins 280, 282, and 284, and interconnections 292, 294, and 295.

Another aspect of the present invention involves the physical interconnection of circuit elements within gate array sites 15. Referring to FIG. 8, the drain, source, and gate contact points (i.e., pins) of transistors 30–60 are preferably fixed (shown generally in FIG. 2 as transistor 25) and extend into the metal 1 layer directly above the gate array site. With this implementation, gate array sites 15 may be programmed by merely adding interconnect segments to the metal 1 layer to form a desired gate array cell. This approach is desirable because it eliminates the need to recreate multiple mask layers to interconnect the gate array sites. However, in certain embodiments having complicated circuit designs, it may be desirable to use multiple mask layers to interconnect the gate array sites.

Figure 14:
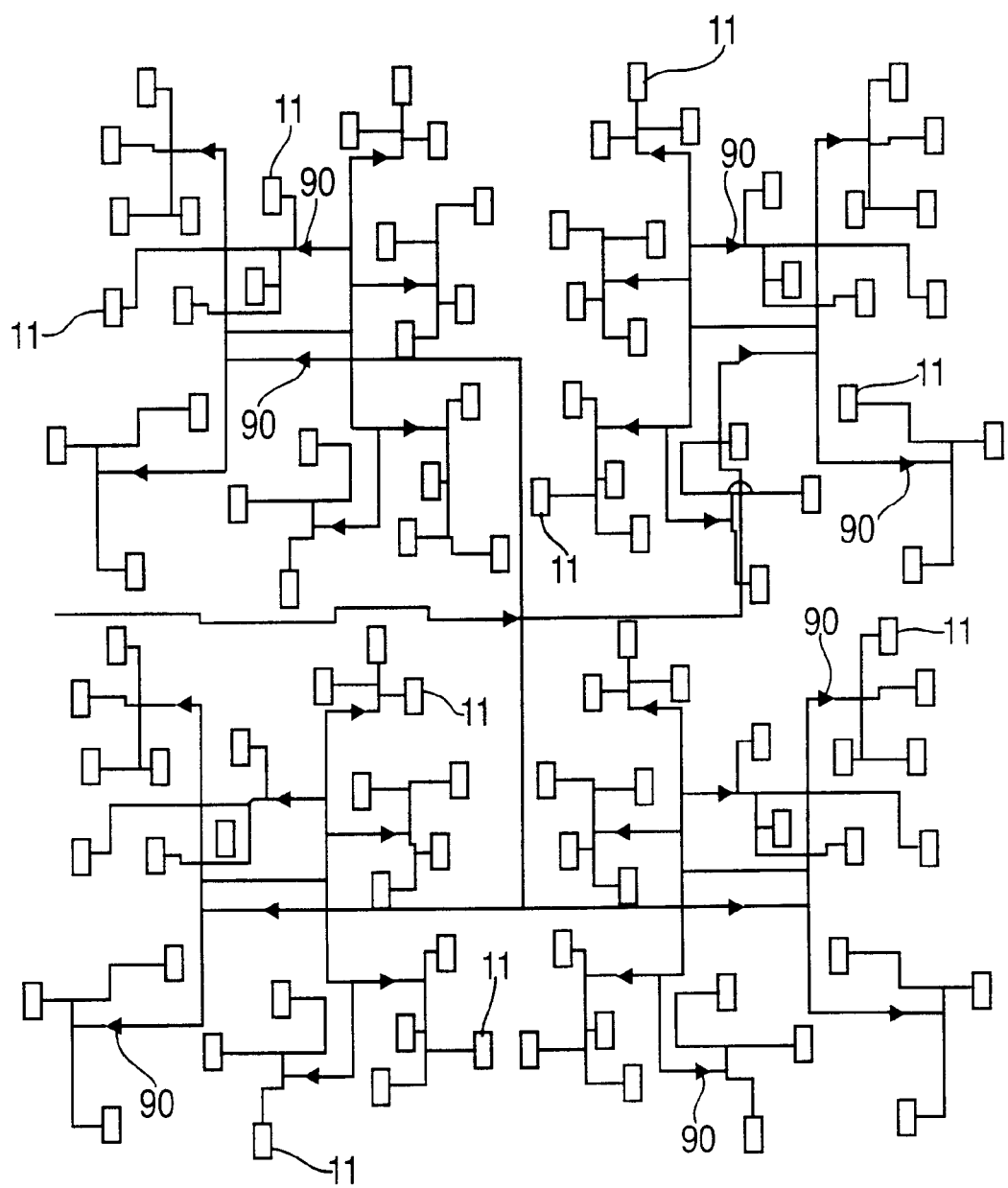
FIG. 14 is a simplified block diagram of a mask-programmable logic device in accordance with the present invention illustrating programmed gate array sites interposed between certain logic resources on the mask-programmable logic device.

As mentioned above, gate array sites 15 may be used to correct a variety of problems including signal attenuation, routing errors, set up or hold time violations, testability violations, antenna violations etc. For example, gate array sites 15 may be programmed to function as buffers to amplify signals that have become attenuated due to long distance connections or excessive fanout. In this case, some gate array sites 15 are configured as buffers that are connected to specific interconnection segments in the mask-programmed interconnect to interpose buffers between the desired portions of device 20. FIG. 14 shows gate array sites 15 configured as buffers 90 interposed between various logic elements 11.

Gate array sites 15 may also be used to optimize interconnection paths to increase signal speed (a set-up time violation) or to act as delay elements in the case of a hold-time violation. To increase signal speed, gate array sites 15 may be connected to various interconnection segments in the mask-programmed interconnect to optimize routing thereby increasing signal speed (buffers may also be used to increase signal speed, slew rate, etc., if desired). In the case of hold time violations, gate array sites 15 configured as delay elements may be connected to specific interconnection segments in the mask-programmed interconnect to interpose the desired signal delay between the desired portions of device 10.

Gate array sites 15 may also be used to provide visibility into the circuit design for testing purposes. For example, gate array sites 15 may be configured so that during testing feedback loops are eliminated and synchronous resets are disabled so that substantially all the nodes within device 10 are both controllable and visible through I/O portions 16. This may be done for example, by configuring some gate array sites 15 to function as multiplexers and coupling them to certain dedicated I/O pins (not shown).

Figure 15:
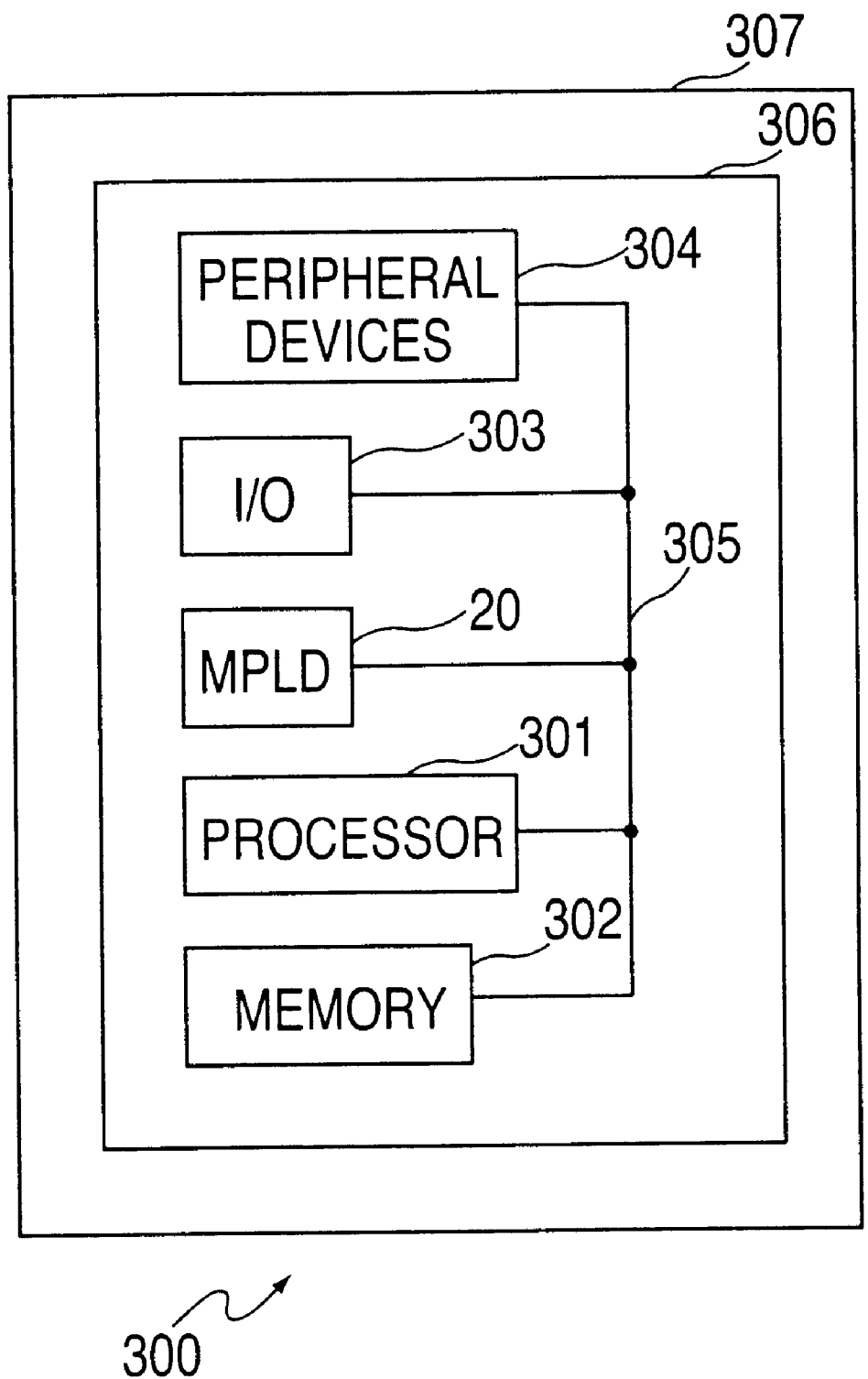
FIG. 15 is a simplified block diagram of an illustrative system employing a programmable device in accordance with the invention.

Mask-programmed logic device 20 based on mask-programmable device 10 described above may be used as part of a data processing system 300 shown in FIG. 15. Data processing system 300 may include one or more of the following components: a processor 301; memory 302; I/O circuitry 303; and peripheral devices 304. These components are coupled together by a system bus 305 and are populated on a circuit board 306 which is contained in an end-user system 307.

System 300 can be used in a wide variety of applications, such as computer networking, data networking, instrumentation, video processing, digital signal processing, or any other application where the advantage of using mask-programmable logic is desirable. Mask-programmed logic device 20 can be configured to perform a variety of different logic functions. For example, mask-programmed logic device 20 can be configured as a processor or controller that works in cooperation with processor 301. Mask-programmed logic device 20 may also be used as an arbiter for arbitrating access to a shared resource in system 300. In yet another example, mask-programmed logic device 20 can be configured as an interface between processor 301 and one of the other components in system 300. It should be noted that system 300 is only exemplary, and that the true scope and spirit of the invention should be indicated by the following claims.

Various technologies can be used to implement mask-programmable logic devices 10 as described above according to this invention. For example, although gate array sites have been described herein as mask-programmable, other one-time programmable technologies may also be used to program gate array sites 15 (e.g., fuse-programmable technologies).

It will be understood that the foregoing is only illustrative of the principles of the invention, and that various modifications can be made by those skilled in the art without departing from the scope and spirit of the invention, and the present invention is limited only by the claims that follow.

What is claimed is:

1. A mask-programmable logic device disposed on an integrated circuit comprising:
    a plurality of mask-programmable logic regions disposed on a substrate of the integrated circuit;
    a plurality of interconnection conductors coupled to the mask-programmable logic regions and disposed above the substrate for interconnecting the mask-programmable logic regions; and
    a plurality of gate array sites disposed on the substrate, the gate array sites being programmable to perform at least one function that facilitates implementation of a circuit design on the mask programmable logic device.

2. The mask-programmable logic device of claim 1 wherein at least some of the plurality of gate array sites are coupled to at least some of the interconnection conductors.

3. The mask-programmable logic device of claim 1 wherein at least one of the gate array sites is programmed-to function as a buffer.

4. The mask-programmable logic device of claim 1 wherein at least one of the gate array sites is programmed to function as a delay element.

5. The mask-programmable logic device of claim 1 wherein at least one of the gate array sites is programmed to provide a logic function selected from the group consisting of a NAND function, a NOR function, an AND function, an OR function, an inverter function, an XOR function, an exclusive NOR function, or any combination thereof.

6. The mask-programmable logic device of claim 1 wherein at least two of the gate array sites are coupled together and programmed to form a complex logic circuit.

7. The mask-programmable logic device of claim 6 wherein the complex logic circuit is a flip-flop or a latch.

8. The mask-programmable logic device of claim 1 wherein the gate array sites, when programmed, include at least one transistor.

9. The mask-programmable logic device of claim 1 wherein the gate array sites are fuse programmable.

10. The mask-programmable logic device of claim 1 wherein at least one of the gate array sites includes a fixed contact point that extends from the substrate to a first mask layer.

11. The mask-programmable logic device of claim 10 further comprising at least one interconnection segment coupled to the fixed contact point and located on a mask layer for programming the at least one of the gate array sites to perform a logic function.

12. A mask-programmable logic device disposed on an integrated circuit comprising:
   a plurality of mask-programmable logic regions disposed on a substrate of the integrated circuit;
   a plurality of interconnection conductors coupled to the mask-programmable logic regions and disposed above the substrate for interconnecting the mask-programmable logic regions; and
   a plurality of gate array sites disposed on the substrate, the gate array sites being programmable to perform at least one function that facilitates implementation of a circuit design on the mask-programmable logic device, wherein the gate array sites are distributed uniformly throughout the mask-programmable logic regions.

13. A mask-programmable logic device disposed on an integrated circuit comprising:
   a plurality of mask-programmable logic regions disposed on a substrate of the integrated circuit;
   a plurality of interconnection conductors coupled to the mask-programmable logic regions and disposed above the substrate for interconnecting the mask-programmable logic regions; and
   a plurality of gate array sites disposed on the substrate, the gate array sites being programmable to perform at least one function that facilitates implementation of a circuit design on the mask-programmable logic device, wherein at least some of the gate array sites are located at a boundary between adjacent logic regions.

14. A mask-programmable logic device disposed on an integrated circuit comprising:
   a plurality of mask-programmable logic regions disposed on a substrate of the integrated circuit;
   a plurality of interconnection conductors coupled to the mask-programmable logic regions and disposed above the substrate for interconnecting the mask-programmable logic regions; and
   a plurality of gate array sites disposed on the substrate, the gate array sites being programmable to perform at least one function that facilitates implementation of a circuit design on the mask-programmable logic device, wherein at least some of the gate array sites are located at a boundary between a logic region and an I/O block.

15. A method for correcting implementation errors in a mask-programmable logic device comprising:
   creating a mask programmable logic device from a preexisting circuit design;
   testing the mask programmable logic device for implementation errors; and then
   adding additional circuit elements to the mask programmable logic device to correct any implementation errors detected, wherein the additional circuit elements are added to the mask programmable logic device by programming at least one gate array site to perform a function that facilitates correction of a detected error.

16. The method of claim 15 wherein the adding further comprises programming at least one gate array site to function as a buffer.

17. The method of claim 15 wherein the programming further comprises programming at least one gate array site to function as a delay element.

18. The method of claim 15 wherein the programming further comprises interconnecting logic resources within the logic device with at least one of the gate array sites with interconnection segments.

19. The method of claim 18 characterized by placing the interconnection segments on a metal 1 layer.

20. The method of claim 15 wherein the programming further comprises programming at least one of the gate array sites to correct a Set-up time violation.

21. The method of claim 15 wherein the programming further comprises programming at least one of the gate array sites to correct a Hold-time violation.

22. A method for correcting implementation errors in a mask-programmable logic device comprising:
   creating a mask-programmable logic device design from a preexisting circuit design;
   testing the mask-programmable logic device design for implementation errors; and
   adding additional circuit elements to the mask-programmable logic device design to correct any implementation errors detected, wherein the additional circuit elements are added to the mask-programmable logic device design by programming at least one gate array site to perform a function that facilitates correction of a detected error, and wherein the programming further comprises programming at least one of the gate array sites to correct a testability violation.

23. A digital processing system comprising:
   processing circuitry;
   a memory coupled to said processing circuitry; and
   a mask-programmable logic device as defined in claim 1 coupled to the processing circuitry and the memory.

24. A printed circuit board on which is mounted a mask-programmable logic device as defined in claim 1.

25. The printed circuit board defined in claim 24 further comprising:
   memory circuitry mounted on the printed circuit board and coupled to the mask-programmable logic device.

26. The printed circuit board defined in claim 25 further comprising:
   processing circuitry mounted on the printed circuit board and coupled to the memory circuitry.

* * * * *